(12) United States Patent
Harden, Jr. et al.

(10) Patent No.: US 6,247,639 B1
(45) Date of Patent: Jun. 19, 2001

(54) FIXED-GAP SOLDER REFLOW METHOD

(75) Inventors: James A. Harden, Jr.; Randall J. Boudreaux, both of Colorado Springs, CO (US)

(73) Assignee: Medallion Technology, LLC, Houston, TX (US)

( * ) Notice: Subject to any disclaimer, the term of this patent is extended or adjusted under 35 U.S.C. 154(b) by 0 days.

(21) Appl. No.: 09/069,524

(22) Filed: Apr. 29, 1998

(51) Int. Cl.[7] .............................. B23K 31/02; H05K 3/34
(52) U.S. Cl. ..................... 228/234.2; 228/175; 228/189; 29/840
(58) Field of Search ............................ 228/234.2, 189, 228/180.21, 175; 29/840

(56) References Cited

U.S. PATENT DOCUMENTS

| | | | |
|---|---|---|---|
| 4,892,245 | * | 1/1990 | Dunaway et al. ............... 228/234.2 |
| 4,927,697 | * | 5/1990 | IHill .................................... 428/198 |
| 4,949,896 | * | 8/1990 | Peterson ............................ 228/205 |
| 4,993,148 | * | 2/1991 | Adachi et al. ...................... 29/832 |
| 4,998,342 | * | 3/1991 | Bonnell et al. .................... 29/840 |
| 5,120,678 | * | 6/1992 | Moore et al. ..................... 228/175 |
| 5,240,738 | * | 8/1993 | Quirk ................................. 427/96 |
| 5,346,117 | * | 9/1994 | Kohn et al. .................. 228/180.22 |
| 5,438,749 | * | 8/1995 | Runyon .............................. 29/825 |
| 5,533,904 | * | 7/1996 | Nobel et al. ...................... 439/67 |
| 5,644,475 | * | 7/1997 | Woychik et al. ................. 361/767 |
| 5,727,727 | * | 3/1998 | Ead ............................... 228/123.1 |
| 5,740,730 | * | 4/1998 | Thompson, Sr. ................. 101/127 |
| 5,842,275 | * | 12/1998 | McMillan, II et al. ............ 29/840 |
| 5,906,310 | * | 5/1999 | Vinciarelli ..................... 228/123.1 |
| 5,984,166 | * | 11/1999 | Holzmann ........................ 228/254 |
| 6,009,619 | * | 1/2000 | Lauffer .............................. 29/847 |
| 6,036,502 | * | 3/2000 | Neidich et al. .................... 439/67 |

FOREIGN PATENT DOCUMENTS

2139132 * 11/1984 (GB) ............................. 228/234.2

OTHER PUBLICATIONS

"Fluorinert® Electronic Liquids," 1984 Product Information, Commercial Chemicals Divisions/3M, Feb. 1984.*

* cited by examiner

Primary Examiner—Patrick Ryan
Assistant Examiner—L. Edmondson
(74) Attorney, Agent, or Firm—John R. Ley; Roger Fulghum (57) ABSTRACT

A method is provided for forming a plurality of solder joints for electrically and mechanically coupling a printed circuit board (100) and a flexible circuit (101). Solder is applied to the connection surfaces of the printed circuit board (100), and the connection surfaces of the flexible circuit (101) are tinned. The circuit board (100) and flexible circuit (101) are then positioned so that the connections surfaces of each are in alignment and a gap exists between circuit board (100) and flexible circuit (101). The gap between circuit board (100) and flexible circuit (101) is precisely controlled and permits the solder of the printed circuit to be in contact with the connection surfaces of the flexible circuit (101). The solder is reflowed by applying heat by vapor phase condensation.

31 Claims, 3 Drawing Sheets

FIXED-GAP SOLDER REFLOW METHOD

TECHNICAL FIELD OF THE INVENTION

The present invention relates in general to a method for soldering together two electrical devices, and, more particularly, to a method for forming a plurality of closely spaced solder joints between two electrical devices. The method employs a vapor phase solder reflow process that does not require that the electrical devices or the solder be physically contacted in order to cause the solder to reflow and form the solder joints.

BACKGROUND OF THE INVENTION

Flexible circuits, or "flex" circuits, are commonly used to interconnect electronic devices, and particularly electronic devices that exist on printed circuit boards. Flexible circuits have the ability to bend so as to exist in three dimensions, rather than the two dimensions within which printed circuit boards lie, and, therefore, are a particularly advantageous way of interconnecting printed circuit boards that lie in different planes or are subject to relative movement. Although flex circuits provide an advantageous means for interconnecting electronic devices existing on rigid printed circuit boards, the connection of the flex circuit to the printed circuit board is of critical importance if it is to operate properly.

A flexible circuit is typically connected to a printed circuit board through multiple finger-like projections that extend from one end of the flex circuit. These "fingers" are exposed copper connections that are extensions of traces in the flex circuit. Each finger will correspond to a pad that is etched on the printed circuit board to which it is to be connected, with each pad being an extension of a trace of the printed circuit board. The corresponding fingers and pads are electrically and mechanically coupled together by solder, with each separate corresponding finger-pad pair being individually soldered together. In a typical flex circuit there are many fingers positioned in close proximity to one another. The center-to-center distance between adjacent fingers can be in the order of 15–20 thousandths of an inch and will likely grow smaller in the future.

Known methods for soldering a flex circuit to a printed circuit board involve what is known as "hot bar" reflow process. Solder is placed on each finger of the flex circuit and on each corresponding pad of the printed circuit board in a process known as "tinning." The flex circuit is then positioned so that the solder on the corresponding fingers and pads are opposite and adjacent to one another. A hot bar is then brought down onto the printed circuit board so that it is physically touching and applying pressure to the printed circuit board across a location just opposite the pads of the printed circuit board. The hot bar is sized to match the footprint of the area to be soldered. The heat from the hot bar is conducted through the printed circuit board and through the pad and solder, causing the solder to reflow to form a solder joint between the printed circuit board and the flex circuit.

The hot bar reflow process has problems and disadvantages associated with it that render it difficult to make reliable, consistent solder joints across all fingers and corresponding pads. First, temperature variations across the bar are common, resulting in variations in the quality of the solder joints. Similarly, any variation in the way in which the bar is positioned against the printed circuit board will affect the quality of the solder joints. For example, if the hot bar is not perfectly parallel, heat will be applied unevenly across the solder area. More importantly, the pressure that must be applied by the bar against the printed circuit board will often result in the solder being squeezed out of the target area where the connection is to be made. This can result in adjacent fingers and pads being interconnected, creating a defect known as "solder bridging," which can have detrimental affects on the operation of the assembly. The hot bar reflow process can also result in weak solder joints. Moreover, the quality of the solder connection is difficult to determine due to the lack of a peripheral meniscus around the joined pads.

The hot bar reflow process can also cause physical destruction or degradation of the printed circuit board itself. The temperature and pressure of a hot bar that is brought in direct physical contact with the printed circuit board frequently causes burning or scorching of the surface of the printed circuit board and sometimes will also cause warping or delamination. Further, the plastic or polymer substrate material of the printed circuit board and the copper traces of the printed circuit board have significantly different rates of thermal expansion. As the polymer substrate expands more rapidly under the influence of the heated hot bar, the copper traces tend to pull away from the polymer substrate, causing the copper fingers to become delaminated from the printed circuit board.

Another method by which soldering can be done is through point-to-point connections, rather than by attempting to form all solder joints at once, as with a hot bar solder reflow process. The point-to-point method is extremely labor intensive and unreliable due to the limit of human ability to work accurately with such close pitches.

SUMMARY OF THE INVENTION

Accordingly, a need exists for a process for soldering together two electrical devices, such as a printed circuit board and a flex circuit, that is more reliable, that will result in superior solder joints that are conducive to and can withstand high volume production, and that will not be subject to the problems associated with the hot bar reflow process that have been described above.

In accordance with the present invention, a method is provided for forming a plurality of solder joints for electrically and mechanically coupling together first and second electrical devices. An amount of solder is applied to the connection surfaces of the first and second electrical devices. The first and second electrical devices are positioned relative to one another so that a gap exists therebetween and so that the solder applied to each connection surface of the first electrical device is substantially aligned with a respective connection surface of the second electrical device. Heat is applied by vapor phase condensation to cause the solder to reflow. The reflowed solder is allowed to cool, thereby solidifying and forming a solder joint to electrically and mechanically couple the first and second electrical devices.

In one embodiment of the present invention, a mechanical fixture may be used to position the first and second electrical devices. Further, an adhesive blocker may be positioned between the first and second electrical devices, and an adhesive may be applied to fix the distance of the gap between the first and second electrical devices. The first and second electrical devices may comprise, for example, a printed circuit board and a flexible circuit.

DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1A:
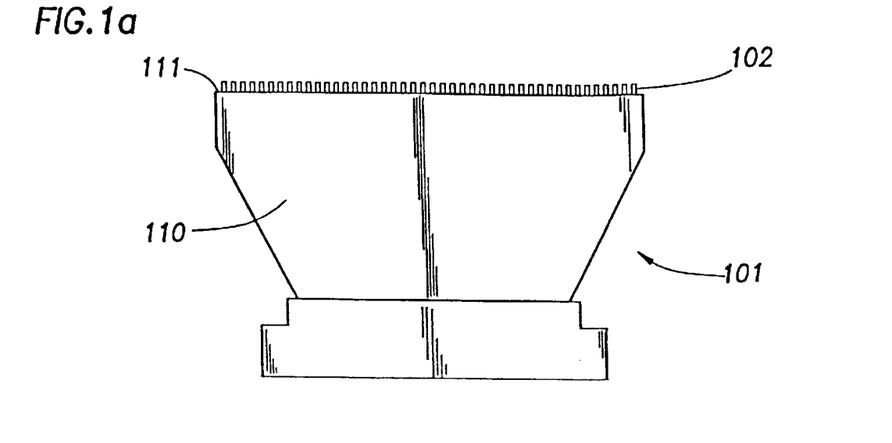
FIG. 1a is a top view of a representative flexible circuit.
Figure 1B:
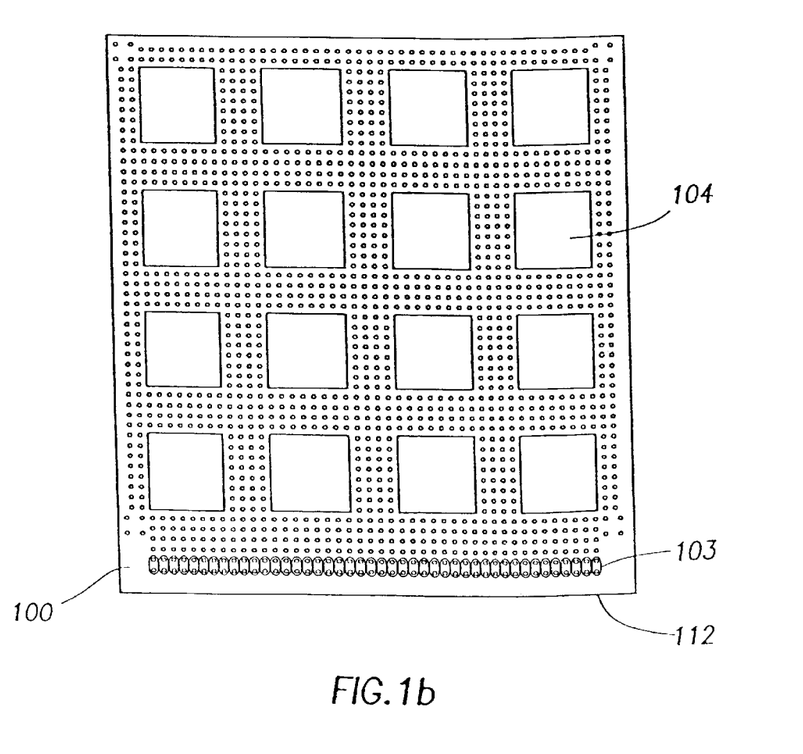
FIG. 1b is a top view of a representative printed circuit board.

FIG. 1b is a top view of a representative printed circuit board 100, and FIG. 1a is a top view of a representative flex circuit 101. Flex circuit 101 includes an interior portion 110, an exterior edge 111, and a plurality of connection surfaces 102, which may be metallic projections or "fingers" that extend from the exterior edge 111 of flex circuit 101. Fingers 102 are exposed copper extensions of traces within flex circuit 101 (not shown) and can be electrically connected to printed circuit board 100 or other electrical circuits and devices. Printed circuit board 100 includes a plurality of pads 103, typically made of copper, which also provide a means by which traces in printed circuit board 100 can be electrically connected to other electrical devices and circuits. The plurality of pads 103 are substantially aligned with and adjacent to an exterior edge 112 of printed circuit board 100. Printed circuit board 100 will typically contain a variety of active and/or passive, surface mount or through-hole electronic devices 104, such as integrated circuits, resistors, capacitors, diodes, or the like. The distance between adjacent fingers 102 of flex circuit 101, and, similarly, the distance between the adjacent pads 103 of the printed circuit board 100 can be in the order of 15–20 thousandths of an inch or smaller.

Figures 2, 2A:
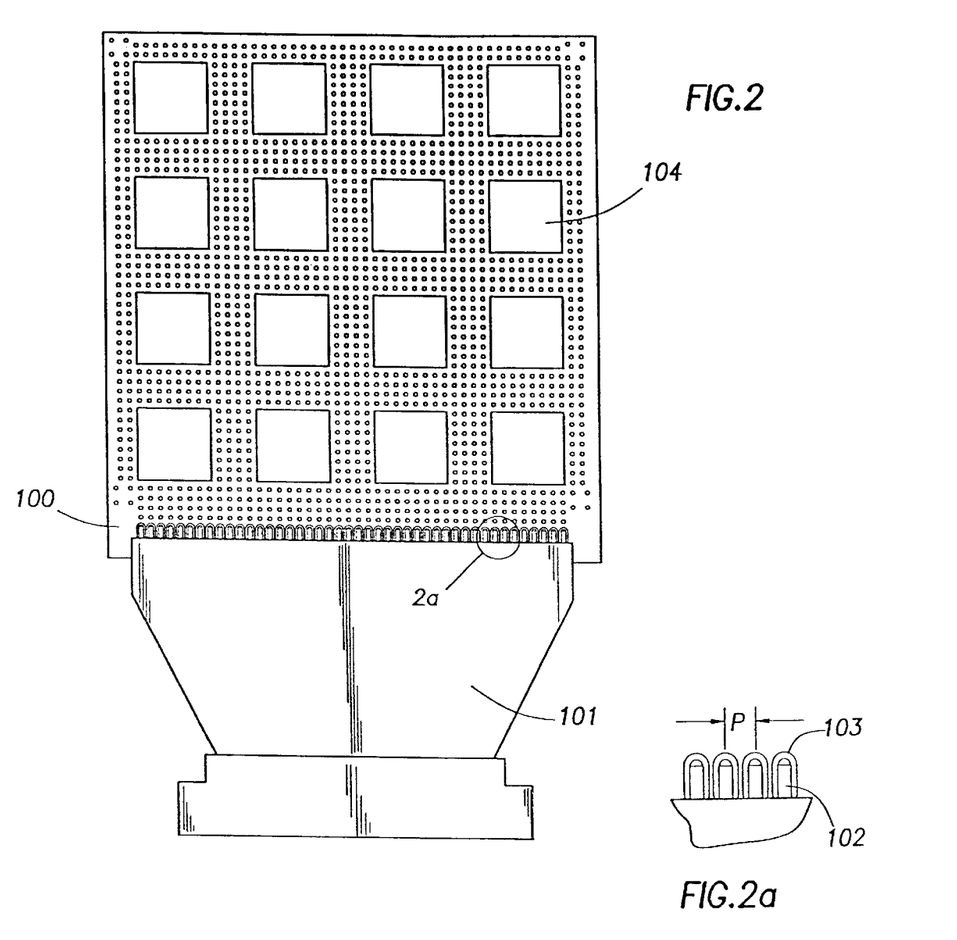
FIG. 2 is a top view of a printed circuit board and a flexible circuit positioned so that corresponding pairs of pads and fingers thereof are aligned.
FIG. 2a is an enlarged view of the pads and fingers circumscribed by circle 2a shown in FIG. 2.

The fingers 102 of the flex circuit 101 and the pads 103 of the printed circuit board 100 correspond to one another, and can be considered as corresponding pairs that can be aligned, as shown in FIG. 2, and electrically coupled to one another. When so aligned, an electrical connection between flex circuit 101 and printed circuit board 100 is achieved by direct contact between the corresponding elements, or, more typically, by an indirect mechanical contact through an electrically conductive medium, such as through solder.

The center-to-center distance between adjacent solder pads 103, shown as "pitch" P in FIG. 2a, can be on the order of 15–20 thousandths of an inch. This distance, however, will likely decrease for future applications. A pitch of this magnitude presents great difficulty in using currently known methods for achieving the soldered connections, or solder joints, between flex circuit 101 and the printed circuit board 100. Accordingly, the present invention involves a new method for providing such solder joints.

The method of the present invention involves a vapor phase solder reflow technique that will accomplish the necessary solder reflow without requiring the application of external pressure or the direct application of heat to the electrical devices or the solder. This method will now be described with reference to FIGS. 3–5. According to the present invention, solder is first applied to both the fingers 102 extending from the edge of flex circuit 101 and the corresponding pads 103 of printed circuit board 100 in such a manner as to yield a thin and consistent tinning of the exposed copper surfaces. According to one embodiment, the fingers of the flex circuit are pre-tinned by dipping the fingers in a pot or container filled with flux, and then dipping the fingers in a pot or container filled with molten solder, followed by air cooling of the tinned fingers. Flux is a product well known in the art that improves the ability of solder to reflow.

Figure 3:
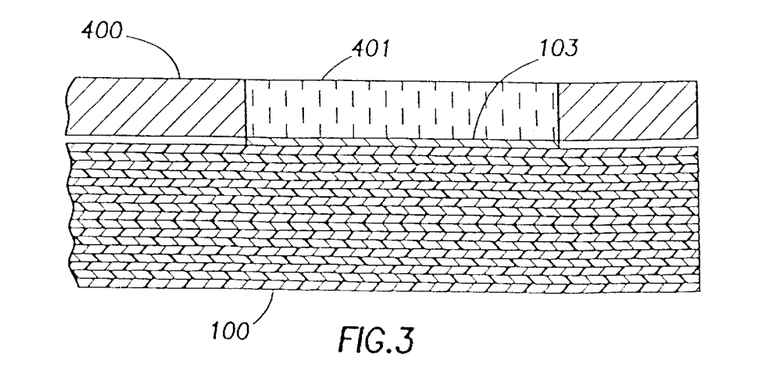
FIG. 3 is a side view illustrating a template positioned on a printed circuit board.
Figure 4:
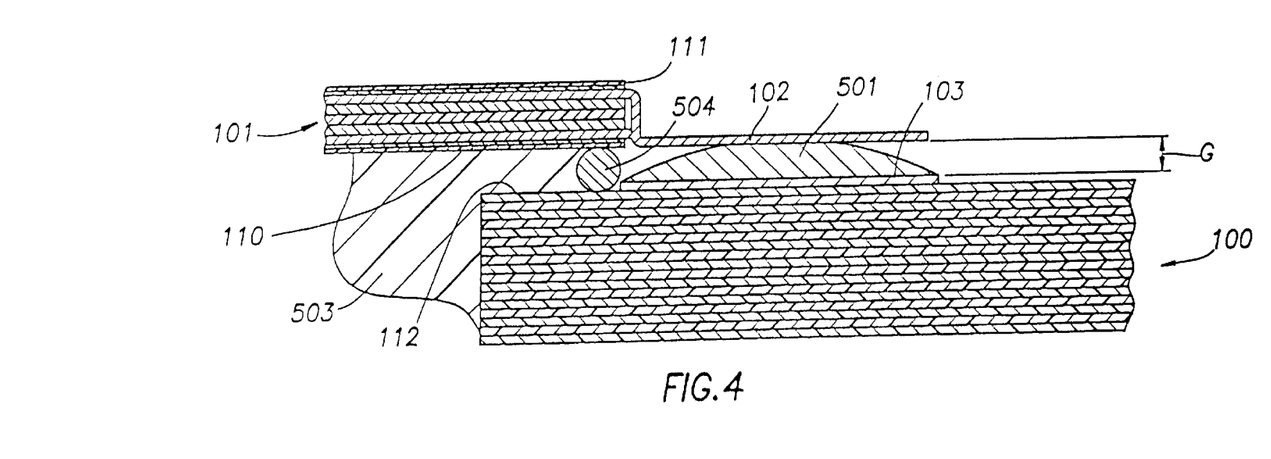
FIG. 4 is a side view illustrating a printed circuit board and a flexible circuit fixedly secured to one another by an adhesive.

Similarly, it is desirable to have solder paste of uniform height on the pads 103 of the printed circuit board 100. One method for achieving this objective is through conventional and well-known screening techniques. This method involves using a "screen" or a template 400 having openings 401 etched through that correspond to the location of the pads 103 on which solder is desired, as shown in FIG. 3. Screen 400 is placed on printed circuit board 100 so that each of the pads 103 to which solder is to be applied is coextensive with a separate opening 401 in screen 400. A solder paste consisting of solder and flux is applied over screen 400. The excess solder paste is removed so that only so much solder remains as is necessary to fill the openings 401. Screen 400 is subsequently removed, leaving only the solder paste 501 on the pads 103 of printed circuit board 100, as shown in FIG. 4. In this manner the quantity of solder applied to the pads 103 and the uniformity of the solder paste deposited on the pads 103 can be precisely controlled through selection of the thickness of screen 400. In one embodiment, a solder mask or screen 400 with a height of approximately six thousandths of an inch is used.

Once the solder is properly applied to the pads of the printed circuit board 100, the flex circuit 101 is positioned so that the fingers 102 of flex circuit 101 are aligned with and positioned opposite pads 103 and the solder paste deposits 501 of printed circuit board 100. Referring to FIG. 4, printed circuit board 100 and flex circuit 101 are aligned so that a predetermined gap G exists therebetween. Gap G typically measures between 4 and 6 thousandths of an inch such that the solder paste deposits 501 of pads 103 firmly contact the fingers 102 of flex circuit 101. The distance of gap G is precisely determined and permits the solder paste deposit 501 of printed circuit board 100 to be in proximity to the fingers 102 of flex circuit 101. The correct positioning of circuit board 100 and flex circuit 101 can be achieved by any suitable device, including a mechanical fixture used in conjunction with a microscope to align and position accurately printed circuit board 100 relative to flex circuit 101.

According to one embodiment of the invention, the relative positioning of printed circuit board 100, flex circuit 101, and the gap G therebetween may be more permanently fixed before the soldering process begins by applying an adhesive or glue 503, such as an epoxy resin, to fixedly secure the exterior edge 112 of printed circuit board 100 to an interior portion 110 of flex circuit 101, as shown in FIG. 4. An adhesive 503 having a high viscosity is necessary so that, during the curing of the adhesive, the adhesive will not interfere with the solder. Adhesives having sufficiently low viscosities may seep into the gap G and interfere with the solder on either the pad 103 of printed circuit board 100 or fingers 102 of flex circuit 101. Further, a blocking device 504 may be interposed between flex circuit 101 and printed circuit board 100, and between solder paste deposit 501 and interior portion 110 of flex circuit 101. Blocking device 504 is positioned generally near solder paste 501 or pads 103 of printed circuit board 100. Blocking device 504 prevents adhesive 503, when applied and cured, from reaching the area of solder reflow between printed circuit board 100 and the fingers 102 of flex circuit 101. Blocking device 504 can be any suitable material, and, in one embodiment of the invention, is a polyester thread. After blocking device 504 is in place, adhesive 503 is applied and cured appropriately. An example of a suitable adhesive 503 is Bondline 6150. Blocking device 504 may, but need not, be removed either before or after the soldering process. Once adhesive blocker 504 is in place, and adhesive 503 has been applied to fixedly secure printed circuit board 100 to flex circuit 101, thereby fixing the gap G between the two, the assembly is ready for soldering.

The method of the present invention involves a vapor phase solder reflow process. Vapor phase reflow is a process by which a heat transfer medium or service medium is heated until at least a portion of it vaporizes. According to the present invention, this service medium is an inert material, like Fluorinert®, that has a high specific heat and a boiling point that is close to the reflow temperature of the solder to be reflowed. Vapor phase reflow soldering machines are known in the art. One example of such a machine is manufactured by Japan Pulse Laboratories, Inc. of Gumma, Japan. The assembly of the printed circuit board 100 fixedly secured to the flex circuit 101 is placed in the vapor phase reflow soldering machine. A heater in the machine heats the Fluorinert®, causing the solder to reflow. To ensure that the solder near all the solderable joints will reflow successfully, a slight amount of pressure maybe applied to flex circuit 101 while flex circuit 101 and printed circuit board 100 are in the chamber of the vapor phase reflow soldering machine. Applying pressure to flex circuit 101 causes adhesive 503 to act as a fulcrum and tends to press the solder on pads 103 against the solder on fingers 102, thereby helping to ensure that a solid joint is formed during reflow.

The use of the vapor phase solder reflow technique described above has significant advantages over the hot bar reflow process. First, because of the physical properties of solder and the use of a service medium such as Fluorinert® that has a high specific heat, the reflow of solder will occur evenly and at a controllable temperature. This will ensure that the printed circuit board and the flex circuit will not be damaged, as often occurs with the hot bar reflow process. Further, because the solder will absorb heat more rapidly than the other elements of the assembly, including printed circuit board 100 and flex circuit 101, the vapor phase reflow technique described above will ensure that the heat resulting from the condensing Fluorinert® is concentrated on the solder and not the surrounding elements or devices.

Another advantage of the vapor phase solder reflow process described above involves the use of a solder having a constant reflow temperature that can be precisely controlled by the selection of the service medium. As an example, although Fluorinert®will always have the same chemical composition, Fluorinert® may have different molecular weights due to varying polymer length. The higher the molecular weight (the longer the polymer), the higher its vaporization temperature. Thus, the vaporization temperature can be controlled by selecting a Fluorinert® composition having a particular boiling point and corresponding molecular weight.

The vapor phase solder reflow technique is further advantageous for close pitch soldering because Fluorinert® acts as a solvent when it condenses on the solder, washing away any remaining flux residue. In this respect, the process is self-cleaning. Another advantage of the vapor phase reflow process is that, unlike the hot bar reflow process, the solder is reflowed by a process that does not involve external physical contact with the electrical devices being electrically and mechanically coupled.

Figure 5:
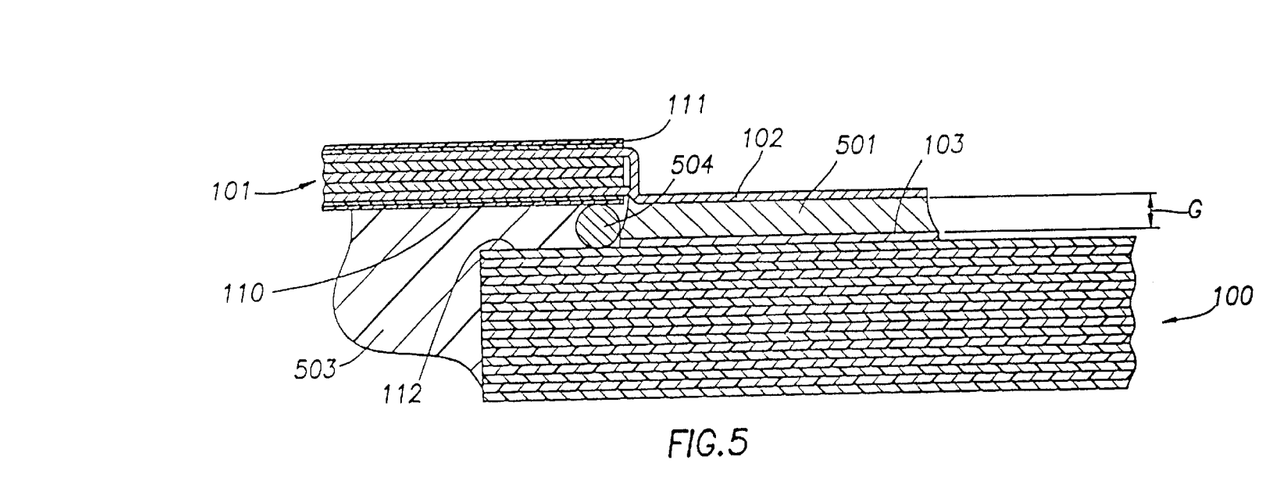
FIG. 5 is a side view of a solder joint formed between a printed circuit board and flexible circuit according to the teachings of the present invention.

Once soldering has been completed, adhesive 503 and adhesive blocker 504 can be removed. However, in many circumstances, it will be desirable to leave adhesive 503 intact to relieve strain on the soldered joints when the entire assembly is subject to flexing or bending. Shown in FIG. 5 is a solder joint following reflow of the solder paste deposit 501. Adhesive 503 and adhesive blocker 504 remain in place. If adhesive 503 is allowed to remain in place, adhesive 503 will absorb mechanical forces that would normally have been applied to the solder joint. In this manner, adhesive 503 serves as a strain relief mechanism, removing the effect of direct mechanical forces applied solely to the solder joint. Excessive stresses absorbed by the solder joint alone may result in poor electrical connections between the connected electrical devices, leading to open or intermittent electrical connections.

The fixed-gap solder reflow process is advantageous because the process of forming a solder joint is accomplished by a series of tightly managed process steps. Further, the positioning of tie devices prior to reflow allows the designer to accurately predict the overall thickness of the finished assembly following the reflow process and the establishment of a secure electrical and mechanical connection between the two electrical devices.

Although the present invention is described herein in relation to the connection of a printed circuit board to a flex circuit, it is to be understood that the invention is not so limited, and can be used to achieve close pitch solder connections between other types of electrical devices, including, for example, the connection of two flex circuits.

From the above description it is clear that the present invention provides a new and superior method for soldering together two electrical devices. Superior solder joints are achieved by the above-described method, which does not require direct physical contact from a heating element or other device to cause solder to reflow to form solder joints. Other modifications of the invention described above will be obvious to those skilled in the art, and it is intended that the scope of the invention be limited only as set forth in the appended claims.

What is claimed is:

1. A method for forming a solder joint for electrically and mechanically coupling connection surfaces of first and second electrical devices, the method comprising the steps of:

applying solder to the connection surface of at least one of the first or second electrical devices;

using a mechanical fixture to position the first and second electrical devices so that a gap exists therebetween and so that the solder applied to the connection surface of the one electrical device is substantially aligned with the connection surface of the second electrical device;

applying a fluid adhesive between the first and second electrical devices;

inserting an adhesive blocker between the first electrical device and the second electrical device and proximate to the connection surfaces of the electrical devices to block the fluid adhesive from flowing onto the connection surfaces;

applying heat to reflow the solder between the connection surfaces; and cooling the reflowed solder into a solidified solder joint between the connection surfaces.

2. The method of claim 1, wherein the step of applying solder to the connection surface further comprises the step of:

applying a predetermined amount of solder to the connection surface which results in confining the reflowed solder between the connection surfaces of the first and second electrical devices when the solder is reflowed without solder bridging to any other adjacent connection surfaces.

3. The method of claim 2, wherein the step of applying the predetermined amount of solder to the connection surface of the one electrical device comprises the steps of:

placing a template of substantially uniform thickness over the connection surface of the one electrical device, the template having an aperture aligned with the connection surface of the one electrical device;

applying solder paste on to substantially fill the aperture of the template with the solder paste;

removing any excess solder paste that protrudes from the aperture; and thereafter removing the template from the upper surface of the one electrical device.

4. The method of claim 1, wherein the step of applying solder to the connection surface of the one electrical device comprises the steps of:

applying flux to the connection surface of the one electrical devices;

applying molten liquid solder to the one connection surface after the flux has been applied; and solidifying a thin layer of solder on the connection surface of the one electrical device prior to reflowing the solder between the connection surfaces.

5. The method of claim 1, further comprising the step of: applying the heat by vapor phase condensation.

6. The method of claim 1, wherein the step of applying solder to the connection surface of the one electrical device comprises the steps of:

placing a template of substantially uniform thickness over the connection surface of the first electrical device, the template having an aperture aligned with the connection surface of the first electrical device;

applying solder paste to substantially fill the aperture of the template;

removing any excess solder paste that protrudes from the aperture; and removing the template from the connection surface of the first electrical device; and further comprising the step of applying solder to the connection surfaces of the other electrical device by steps comprising:

dipping the connection surface of the second electrical device in flux;

dipping the connection surface of the second electrical device in molten solder; and solidifying a thin layer of solder on the connection surface of the second electrical device; and wherein the step of positioning the first and second electrical devices comprises the steps of:

positioning the connection surfaces of the first and second electrical devices so that a gap exists therebetween and so that the solder on the connection surface of the first electrical device is substantially aligned with the solder on the connection surface of the second electrical device; and curing the adhesive between the first electrical device and the second electrical device to fix the distance of the gap.

7. The method of claim 1, further comprising the step of:

fixing the distance of the gap by curing the fluid adhesive between the first and second electrical devices.

8. The method of claim 7, further comprising the step of:

removing the adhesive blocker before applying the heat to reflow the solder.

9. The method of claim 1, further comprising the step of:

removing the adhesive blocker after applying the heat to reflow the solder.

10. A method for forming a solder joint for electrically and mechanically coupling a plurality of connection surfaces of each of first and second electrical devices, the method comprising the steps of:

applying solder to connection surfaces of at least one of the first or second electrical devices;

using a mechanical fixture to position the connection surfaces of the first and second electrical devices so that a gap exists therebetween and so that the solder applied to each connection surface of the one electrical device is substantially aligned with corresponding connection surfaces of the other electrical device;

applying a fluid adhesive between the first electrical device and the second electrical device;

applying an adhesive blocker between the first electrical device and the second electrical device and proximate to the connection surfaces of the electrical devices to block the fluid adhesive from flowing onto the connection surfaces;

applying heat to reflow the solder between the corresponding and aligned connection surfaces; and cooling the reflowed solder into a solidified solder joint between the corresponding connection surfaces.

11. The method of claim 10, wherein the step of applying solder to the connection surfaces further comprises the step of:

applying a predetermined amount of solder to each of the connection surfaces which results in confining the reflowed solder between the corresponding and aligned connection surfaces of the first and second electrical devices when the solder is reflowed without solder bridging to any other adjacent non-corresponding and non-aligned connection surfaces.

12. The method of claim 11, wherein the step of applying the predetermined amount of solder to the connection surfaces of the one electrical device comprises the steps of:

placing a template of substantially uniform thickness over the connection surfaces of the one electrical device, the template having a plurality of apertures each aperture aligned with a respective connection surface of the one electrical device;

applying solder paste to substantially fill the apertures of the template with the solder paste;

removing any excess solder paste that protrudes from the apertures; and thereafter removing the template from the upper surface of the one electrical device.

13. The method of claim 10, wherein the step of applying solder to the connection surfaces of the one electrical device comprises the steps of:

applying flux to the connection surfaces of the one electrical device;

applying molten solder to the connection surfaces of the one electrical device after the flux has been applied; and solidifying a thin layer of solder on the connection surfaces of the one electrical device prior to reflowing the solder between the connection surfaces.

14. The method of claim 10, further comprising the step of:

applying the heat by vapor phase condensation.

15. The method of claim 10, wherein the step of applying solder to the connection surfaces of the one electrical device comprises the steps of:

placing a template of substantially uniform thickness over the connection surfaces of the first electrical device, the template having a plurality of apertures, each aperture aligned with a respective connection surface of the first electrical device;

applying solder paste to substantially fill the apertures of the template;

removing any excess solder paste that protrudes from the apertures;

removing the template from the connection surfaces of the first electrical device; and further comprising the step of applying solder to the connection surfaces of the other electrical device by steps comprising:

dipping the connection surfaces of the second electrical device in flux;

dipping the connection surfaces of the second electrical device in molten solder;

solidifying a thin layer of solder on the connection surfaces of the second electrical device; and wherein the step of positioning the first and second electrical devices comprises the steps of:

positioning the connection surfaces of the first and second electrical devices so that the gap exists therebetween and so that the solder on each connection surface of the first electrical device is substantially aligned with the solder on the corresponding aligned connection surfaces of the second electrical device; and curing the adhesive between the first electrical device and the second electrical device to fix the distance of the gap.

16. The method of claim 10, further comprising the step of:

fixing the distance of the gap by curing the fluid adhesive between the first and second electrical devices.

17. The method of claim 16, further comprising the step of:

removing the adhesive blocker before applying the heat to reflow the solder.

18. The method of claim 10, further comprising the step of:

removing the adhesive blocker after applying the heat to reflow the solder.

19. A method for soldering a printed circuit board having pads to a flexible circuit having connection surfaces, comprising the steps of:

applying solder to the pads of the printed circuit board;

tinning the connection surfaces of the flexible circuit;

using a mechanical fixture to position the printed circuit board and the flexible circuit so that a gap exists between the pads of the printed circuit board and the connection surfaces of the flexible circuit, and so that the solder applied to each of the pads of the printed circuit board is substantially aligned with a respective tinned connection surface of the printed circuit board;

inserting an adhesive blocker positioned between the printed circuit board and the flexible circuit and adjacent to the pads of the printed circuit board to block fluid adhesive from flowing onto the pads and the connection surfaces;

applying a fluid adhesive between the printed circuit board and the flexible circuit;

curing the fluid adhesive to mechanically couple the printed circuit board and the flexible circuit;

applying heat by vapor phase condensation to cause the solder to reflow between the pads and the connection surfaces; and allowing the reflowed solder to cool and solidify to form a plurality of solder joints, the plurality of solder joints mechanically and electrically coupling the printed circuit board and the flexible circuit.

20. A method for forming a solder joint for electrically and mechanically coupling connection surfaces of first and second electrical devices, the method comprising the steps of:

applying solder to the connection surface of at least one of the first or second electrical devices;

using a mechanical fixture to position the first and second electrical devices so that a gap exists therebetween and so that the solder applied to the connection surface of the one electrical device is substantially aligned with the connection surface of the second electrical device;

applying heat to reflow the solder through the gap between the connection surfaces;

cooling the reflowed solder into a solidified solder joint between the connection surfaces;

applying flux to at least one of the connection surfaces prior to applying heat to reflow the solder between the first and second connection surfaces;

applying the heat to reflow the solder by transferring vapor to the connection surfaces and condensing the vapor on the solder and the connection surfaces; and removing any excess flux from the connection surfaces by the condensed vapor.

21. The method of claim 20, wherein the step of applying solder to the connection surface further comprises the step of:

applying a predetermined amount of solder to the connection surface which results in confining the reflowed solder between the connection surfaces of the first and second electrical devices when the solder is reflowed without solder bridging to any other adjacent connection surfaces.

22. The method of claim 21, wherein the step of applying the predetermined amount of solder to the connection surface of the one electrical device comprises the steps of:

placing a template of substantially uniform thickness over the connection surface of the one electrical device, the template having an aperture aligned with the connection surface of the one electrical device;

applying solder paste to substantially fill the aperture of the template with the solder paste;

removing any excess solder paste that protrudes from the aperture; and thereafter removing the template from the upper surface of the one electrical device.

23. The method of claim 20, wherein the step of applying solder to the connection surface of the one electrical device comprises the steps of:

applying flux to the connection surface of the other electrical device;

applying molten liquid solder to the connection surface of the other electrical device after the flux has been applied; and solidifying a thin layer of solder on the connection surface of the other electrical device prior to reflowing the solder between the connection surfaces.

24. The method of claim 20, further comprising the steps of:

applying an adhesive blocker between the first electrical device and the second electrical device and proximate to the connection surfaces of the electrical devices to block fluid adhesive from flowing onto the connection surfaces; and applying a fluid adhesive between the first and the second electrical devices.

25. The method of claim 20, wherein the step of applying solder to the connection surface of the one electrical device comprises the steps of:

placing a template of substantially uniform thickness over the connection surface of the one electrical device, the template having an aperture aligned with the connection surface of the first electrical device;

applying solder paste to substantially fill the aperture of the template;

removing any excess solder paste that protrudes from the aperture; and removing the template from the connection surface of the first electrical device; and further comprising the step of applying solder to the connection surfaces of the other electrical device by steps comprising:

dipping the connection surface of the other electrical device in flux;

dipping the connection surface of the other electrical device in molten solder; and solidifying a thin layer of solder on the connection surface of the other electrical device; and wherein the step of positioning the first and second electrical devices comprises the steps of:

positioning the connection surfaces of the first and second electrical devices so that a gap exists therebetween and so that the solder on the connection surface of the first electrical device is substantially aligned with the solder on the connection surface of the second electrical device;

positioning an adhesive blocker between the first electrical device and the second electrical device and proximate to the connection surfaces of the electrical devices to block fluid adhesive from flowing onto the connection surfaces; and applying and curing a fluid adhesive between the first electrical device and the second electrical device to fix the distance of the gap.

26. A method for forming a solder joint for electrically and mechanically coupling a plurality of connection surfaces of each of first and second electrical devices, the method comprising the steps of:

applying solder to connection surfaces of at least one of the first or second electrical devices;

using a mechanical fixture to position the connection surfaces of the first and second electrical devices so that a gap exists therebetween and so that the solder applied to the connection surfaces of the one electrical device is substantially aligned with corresponding connection surfaces of the other electrical device;

applying heat to reflow the solder through the gap between the corresponding and aligned connection surfaces;

cooling the reflowed solder into a solidified solder joint between the corresponding connection surfaces;

applying flux to the connection surfaces prior to applying heat to reflow the solder between the connection surfaces;

applying the heat to reflow the solder by transferring vapor to the solder applied on the connection surfaces and condensing the vapor on the solder and the connection surfaces; and removing any excess flux from the connection surfaces by the condensed vapor.

27. The method of claim 26, wherein the step of applying solder to the connection surfaces further comprises the step of:

applying a predetermined amount of solder to each of the connection surfaces which results in confining the reflowed solder between the corresponding and aligned connection surfaces of the first and second electrical devices when the solder is reflowed without solder bridging to any other adjacent non-corresponding and nonaligned connection surfaces.

28. The method of claim 27, wherein the step of applying the predetermined amount of solder to the connection surfaces of the one electrical device, comprises the steps of:

placing a template of substantially uniform thickness over the connection surfaces of the one electrical device, the template having a plurality of apertures each aperture aligned with a respective connection surface of the one electrical device;

applying solder paste to substantially fill the apertures of the template with the solder paste;

removing any excess solder paste that protrudes from the apertures; and thereafter removing the template from the upper surface of the one electrical device.

29. The method of claim 26, wherein the step of applying solder to the connection surfaces of the one electrical device comprises the steps of:

applying flux to the connection surfaces of the one electrical device;

applying molten solder to the connection surfaces of the one electrical device after the flux has been applied; and solidifying a thin layer of solder on the connection surfaces of the one electrical device prior to reflowing the solder between the connection surfaces.

30. The method of claim 26, further comprising the steps of:

applying an adhesive blocker between the first electrical device and the second electrical device and proximate to the connection surfaces of the electrical devices to block fluid adhesive from flowing onto the connection surfaces; and applying a fluid adhesive between the first and the second electrical devices.

31. The method of claim 26, wherein the step of applying solder to the connection surfaces of the one electrical device comprises the steps of:

placing a template of substantially uniform thickness over the connection surfaces of the one electrical device, the template having a plurality of apertures, each aperture aligned with a respective connection surface of the one electrical device;

applying solder paste to substantially fill the apertures of the template;

removing any excess solder paste that protrudes from the apertures;

removing the template from the connection surfaces of the one electrical device; and further comprising the step of applying solder to the connection surfaces of the other electrical device by steps comprising:

dipping the connection surfaces of the other electrical device in flux;

dipping the connection surfaces of the other electrical device in molten solder;

solidifying a thin layer of solder on the connection surfaces of the other electrical device; and wherein the step of positioning the first and second electrical devices comprises the steps of:

positioning the connection surfaces of the first and second electrical devices so that the gap exists therebetween and so that the solder on each connection surface of the first electrical device is substantially aligned with the solder on the corresponding aligned connection surfaces of the second electrical device;

positioning an adhesive blocker between the first electrical device and the second electrical device and proximate to the connection surfaces of the first and second electrical devices to block fluid adhesive from flowing onto the connection surfaces; and applying a fluid adhesive between the first electrical device and the second electrical device to fix the distance of the gap.

\* \* \* \* \*